United States Patent
Park

(10) Patent No.: US 7,521,302 B2
(45) Date of Patent: Apr. 21, 2009

(54) SEMICONDUCTOR DEVICE AND METHOD OF MANUFACTURING THE SAME

(75) Inventor: Joon-Jin Park, Gunpo (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/320,863

(22) Filed: Dec. 30, 2005

(65) Prior Publication Data

US 2006/0148144 A1    Jul. 6, 2006

(30) Foreign Application Priority Data

Dec. 30, 2004    (KR) .................... 10-2004-0117427

(51) Int. Cl.
*H01L 21/00* (2006.01)
(52) U.S. Cl. .................. 438/164; 438/412; 438/413; 438/222; 257/E21.618; 257/E21.628
(58) Field of Classification Search ........... 438/222, 438/164, 199, 196, 413, 412
See application file for complete search history.

(56) References Cited

U.S. PATENT DOCUMENTS

| | | | | |
|---|---|---|---|---|
| 4,481,707 A | * | 11/1984 | Cunniff | 438/189 |
| 6,420,730 B1 | * | 7/2002 | Gardner et al. | 257/67 |
| 6,849,883 B2 | * | 2/2005 | Okihara | 257/192 |
| 7,141,459 B2 | * | 11/2006 | Yang et al. | 438/154 |
| 2003/0094641 A1 | * | 5/2003 | Gonzalez et al. | 257/296 |

* cited by examiner

*Primary Examiner*—W. David Coleman
*Assistant Examiner*—Shaka Scarlett
(74) *Attorney, Agent, or Firm*—Lowe Hauptman Ham & Berner, LLP

(57) ABSTRACT

A method of manufacturing a semiconductor device providing insulation between a plurality of MOS transistors without device isolation regions. The method includes forming a first insulation layer on a substrate, exposing a portion of the substrate by etching the first insulation layer using a resist, growing an epitaxial layer on the exposed portion of the substrate, removing the patterned first insulation layer, and forming transistors on the substrate and epitaxial layer, respectively. The epitaxial layer is grown to a degree that an upper surface of the epitaxial layer is higher than that of the substrate.

6 Claims, 3 Drawing Sheets

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2004-0117427 filed in the Korean Intellectual Property Office on Dec. 30, 2004, the entire contents of which are incorporated herein by reference.

BACKGROUND OF THE INVENTION (a) Field of the Invention

The present invention relates to a semiconductor device and a method of manufacturing the same. More particularly, the present invention relates to a method of manufacturing a semiconductor device including a plurality of MOS transistors that are separately formed in levels of a structure having height differences.

(b) Description of the Related Art

Since semiconductor devices have been highly integrated, a plurality of MOS transistors have been formed on a single wafer. Such MOS transistors are separated by an isolation layer, and such an isolation layer may be formed by using a shallow trench insulation (STI) or local oxidation of silicon (LOCOS) structure.

FIG. 1 is a cross-sectional view showing a conventional method of forming a plurality of MOS transistors on a semiconductor device.

As shown in FIG. 1, three MOS transistors 20, 30, and 40 are formed on a substrate 10, and STI structures 13 and 15 are formed between each transistor.

In order to form the STI structures 13 and 15, a nitride layer (not shown) and a resist are firstly formed on the substrate 10, and then the resist is patterned. The nitride layer is dry-etched by using the patterned resist as an etch mask, and then the substrate 10 is etched by using the etched nitride layer as an etch mask. After depositing an oxide layer on such a trench and an entire surface of the substrate 10, the STI structures 13 and 15 are finally formed by removing the oxide layer and nitride layer on the surface of the substrate through a chemical mechanical polishing (CMP) process.

Consequently, device isolation regions are separated from active regions in which MOS transistors will be formed.

Thereafter, MOS transistors 20, 30, and 40 are formed by performing a general formation process of a MOS transistor.

However, when transistors are separated by using an STI structure, an additional device isolation region is required to form the STI structure. In addition, as shown in FIG. 1, a moat A can be created at edges of the STI structures 13 and 15 during a CMP process for forming the STI structures 13 and 15.

Such a moat may induce a hump phenomenon and an inverse narrow width effect (INWE) in a semiconductor device, and it may induce an abnormal operation of a semiconductor device. Therefore, higher integration of a semiconductor device cannot be easily accomplished because additional spaces are necessary for insulating such a moat, and manufacturing costs can be increased because additional processes are required for insulating such a moat.

The above information described in this Background section is only for enhancement of understanding of the background of the invention and therefore it may contain information that does not form prior art with respect to the present invention.

SUMMARY OF THE INVENTION

The present invention has been made in an effort to provide a method of manufacturing a semiconductor device having advantages of insulating between a plurality of MOS transistors without device isolation regions. That is, transistors are insulated from one another without performing additional processes for insulating a moat, because the transistors are formed in levels of a substrate at different heights. Therefore, higher integration of a semiconductor device can be accomplished and manufacturing costs of a semiconductor device can be reduced.

An exemplary method according to an embodiment of the present invention is to manufacture a semiconductor device having a plurality of transistors on a single substrate. The method includes forming a first insulation layer on the substrate, exposing a portion of the substrate by etching the first insulation layer using a resist, growing an epitaxial layer on the exposed portion of the substrate, removing the patterned first insulation layer, and forming transistors on the substrate and epitaxial layer, respectively.

The epitaxial layer can be grown to a degree that an upper surface of the epitaxial layer is higher than that of the substrate.

The height difference between the upper surface of the epitaxial layer and that of the substrate can be great enough to insulate transistors formed on the epitaxial layer from transistors formed on the substrate.

The transistors can be MOS transistors.

Another exemplary embodiment of the present invention is a semiconductor device having a plurality of transistors on a single substrate. The semiconductor device includes an epitaxial layer which is grown on a portion of the substrate so as to create a height difference between the epitaxial layer and the upper surface of the substrate, and a plurality of transistors which are formed on the substrate and the epitaxial layer, respectively.

The transistors formed on the substrate and the transistors formed on the epitaxial layer are insulated from each other by the height difference between the substrate and the epitaxial layer.

The transistors formed on the substrate and epitaxial layer can be MOS transistors.

DETAILED DESCRIPTION OF THE EMBODIMENTS

Figure 1:
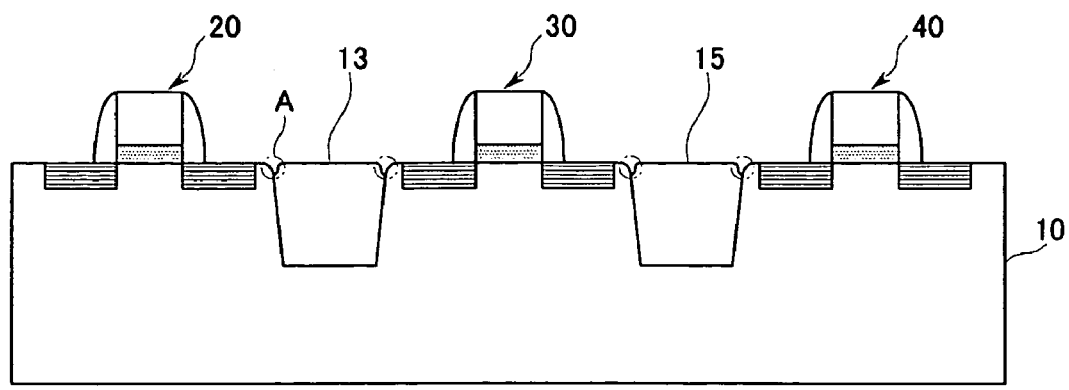
FIG. 1 is a cross-sectional view showing a conventional method of forming a plurality of MOS transistors on a semiconductor device.

An exemplary embodiment of the present invention will hereinafter be described in detail with reference to the accompanying drawings.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. To clarify multiple layers and regions, the thicknesses of the layers are enlarged in the drawings. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Firstly, an exemplary embodiment of the present invention will hereinafter be described in detail with reference to FIG. 2A to FIG. 2F.

FIG. 2A to FIG. 2F are cross-sectional views showing sequential stages of a method of manufacturing a semiconductor device according to an exemplary embodiment of the present invention.

Figure 2A:
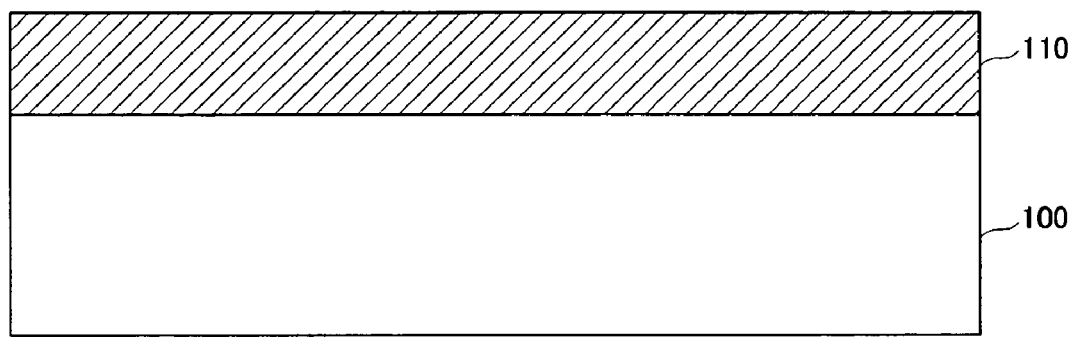
FIG. 2A to FIG. 2F are cross-sectional views showing sequential stages of a method of manufacturing a semiconductor device according to an exemplary embodiment of the present invention.

As shown in FIG. 2A, an oxide layer 110 is deposited on a substrate 100.

Figure 2B:
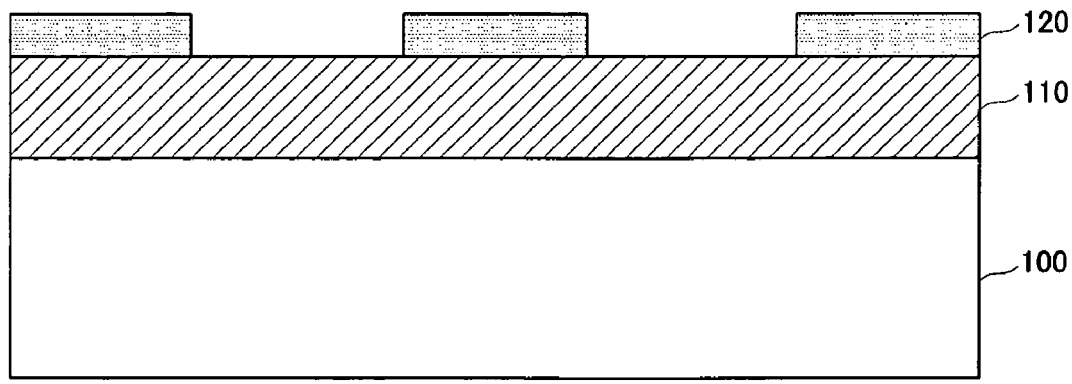

Subsequently, as shown in FIG. 2B, a photoresist pattern 120 is formed on the oxide layer 110.

Figure 2C:
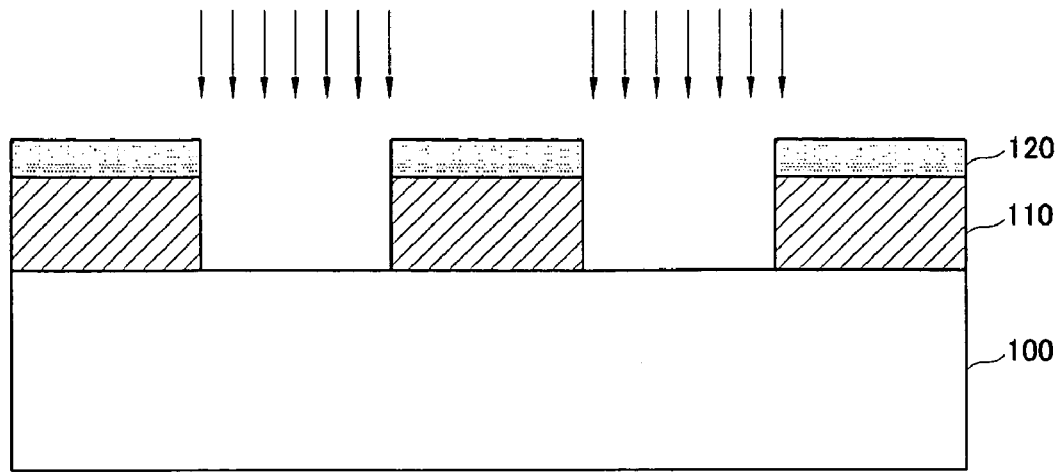

As shown in FIG. 2C, the oxide layer 110 is etched by using the photoresist pattern 120 as an etch mask.

Figure 2D:
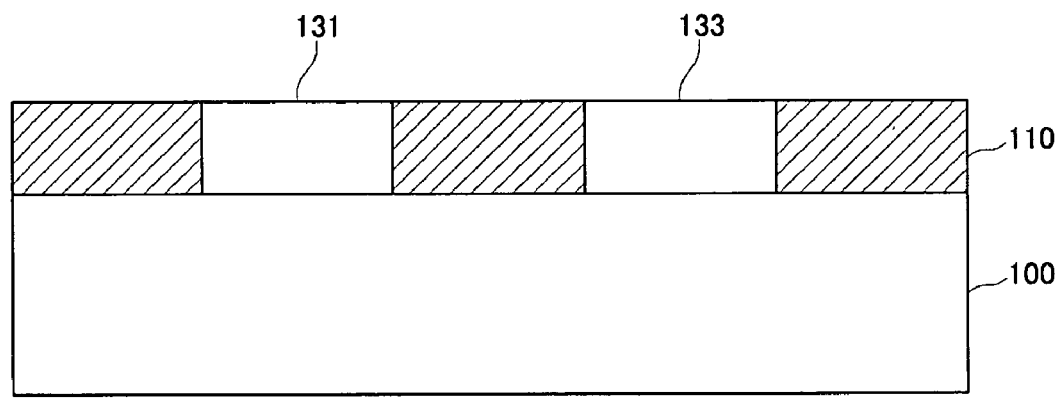

In addition, as shown in FIG. 2D, a structure having a silicon step is made by forming silicon epitaxial layers 131 and 133 in the region where the oxide layer 110 is etched. Here, height differences of upper surfaces of the epitaxial layers 131 and 133 with respect to an upper surface of the substrate 100 should be great enough to insulate transistors formed on the epitaxial layers 131 and 133 from transistors formed on the substrate 100.

Figure 2E:
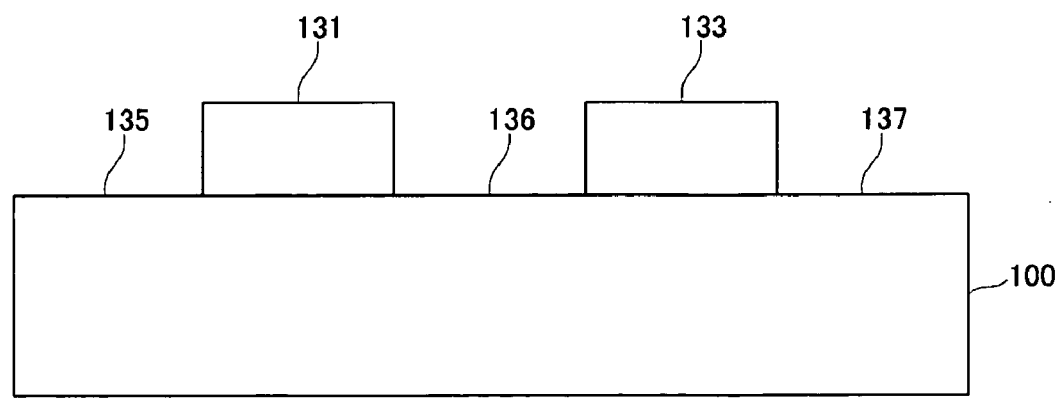

Subsequently, as shown in FIG. 2E, when the oxide layer 110 is completely removed, a structure having a step on the substrate 100 is formed by the silicon epitaxial layer 131 and 133.

Figure 2F:
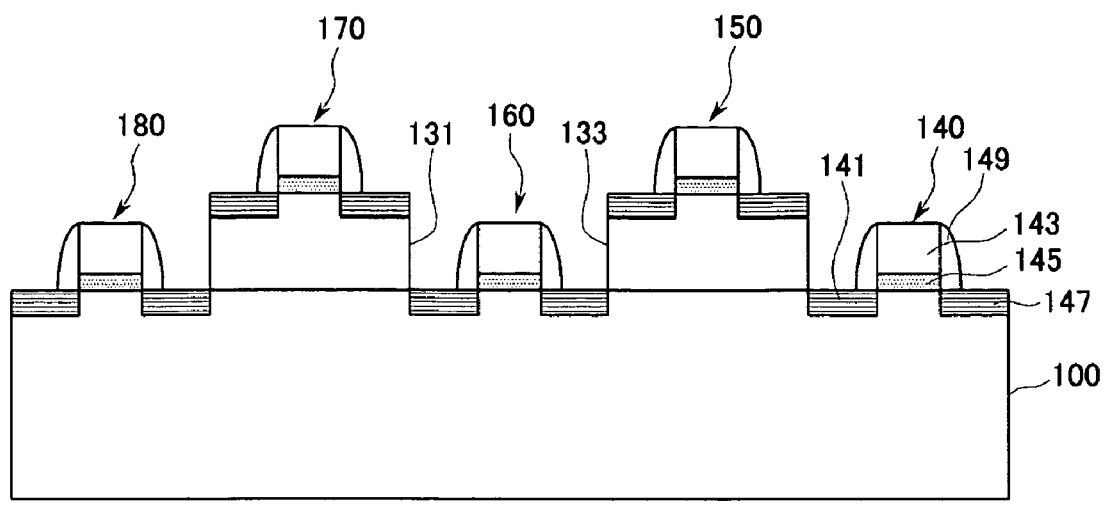

Thereafter, as shown in FIG. 2F, according to a method of forming a MOS transistor, MOS transistors 140, 160, and 180 are formed in device formation regions 135, 136, 137 (referring to FIG. 2E), and MOS transistors 150 and 170 are formed on the epitaxial layer 131 and 133.

Hereinafter, an exemplary embodiment of a forming process for the MOS transistor 140 will be described in detail, and MOS transistors 150, 160, 170, and 180 can also be formed by the same process.

At first, a gate insulation layer 145 is formed on the device formation region 137 in the substrate 100. Here, the gate insulation layer is formed by growing a low-temperature thermal oxide layer under a steam atmosphere at a temperature of 650-750° C.

In addition, a low-temperature oxynitride can be formed by nitriding a surface of the low-temperature thermal oxide layer through a plasma treatment.

Subsequently, a tungsten silicide (WSi2) layer is grown on the gate oxide layer 145 by using low pressure chemical vapor deposition (LPCVD), and heat treatment for the tungsten silicide (WSi2) layer is performed. A gate electrode 143 is formed by patterning the tungsten silicide (WSi2) layer.

Thereafter, a P-type or N-type source/drain extension region (not shown) is formed by ion-implanting P-type or N-type impurities using an additional mask. In addition, an insulation layer spacer 149 is formed on a sidewall of the gate electrode 145, and P-type or N-type source/drain regions 141 and 147 are formed by ion-implanting P-type or N-type high-concentration impurities using an additional mask.

As described above, since a substrate having a height difference is firstly formed by growing an epitaxial layer, and then MOS transistors are formed on each level of the substrate, MOS transistors are separated from one another by the height difference without forming an additional STI structure.

Therefore, according to the exemplary embodiment of the present invention, higher integration of a semiconductor device can be accomplished and manufacturing costs of a semiconductor device can be reduced because additional processes for forming an STI structure are not required. In addition, since the STI structure is not required to be formed in the exemplary embodiment of the present invention, an abnormal operation of a semiconductor device caused by a moat can be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device having a plurality of transistors on a single substrate, comprising:
    forming a first insulation layer on the substrate;
    exposing a portion of the substrate by etching the first insulation layer using a resist;
    growing an epitaxial layer on the exposed portion of the substrate so as to create a height difference between the epitaxial layer and an upper surface of the substrate bordering the epitaxial layer;
    removing the patterned first insulation layer; and
    forming a first transistor on the epitaxial layer and a second transistor on the substrate bordering the epitaxial layer respectively including a gate region and a source/drain region, wherein the first transistor and the second transistor are insulated from each other by the height difference between the substrate and the epitaxial layer without an isolation region between the source/drain region of the first transistor and the source/drain region of the second transistor.

2. The method of claim 1, wherein the epitaxial layer is grown to a degree that an upper surface of the epitaxial layer is higher than an upper surface of the substrate bordering the epitaxial layer.

3. The method of claim 2, wherein the height difference between the upper surface of the epitaxial layer and that the upper surface of the substrate bordering the epitaxial layer is large enough to insulate transistors formed on the epitaxial layer from transistors formed on the substrate.

4. The method of claim 1, wherein the transistors are MOS transistors.

5. A semiconductor device having a plurality of transistors on a single substrate, comprising:
    an epitaxial layer that is grown on a portion of the substrate so as to create a height difference between the epitaxial layer and an upper surface of the substrate bordering the epitaxial layer;
    a first transistor including a first gate and a first source/drain region formed on the epitaxial layer; and
    a second transistor including a second gate and a second source/drain region formed on the substrate bordering the epitaxial layer,
    wherein the first transistor and the second transistor and the second transistor are insulated from each other by the height difference between the substrate and the epitaxial layer without an isolation region between the first source/drain region of the first transistor and the second source/drain region of the second transistor.

6. The semiconductor device of claim 5, wherein the transistors formed on the substrate and epitaxial layer are MOS transistors.

* * * * *